United States Patent
Wu et al.

(10) Patent No.: US 6,930,043 B2
(45) Date of Patent: Aug. 16, 2005

(54) METHOD FOR FORMING DRAM CELL BIT LINE AND BIT LINE CONTACT STRUCTURE

(75) Inventors: Kuo-Chien Wu, Miaoli (TW); Shih-Fan Kuan, Taoyuan (TW)

(73) Assignee: Nanya Technology Corp., Taoyuan (TW)

( * ) Notice: Subject to any disclaimer, the term of this patent is extended or adjusted under 35 U.S.C. 154(b) by 0 days.

(21) Appl. No.: 10/628,507

(22) Filed: Jul. 29, 2003

(65) Prior Publication Data

US 2005/0026409 A1 Feb. 3, 2005

(51) Int. Cl.[7] .............................................. H01L 21/44
(52) U.S. Cl. ...................... 438/666; 438/624; 438/660; 438/672
(58) Field of Search ................................ 438/666, 597, 438/624, 660, 672

(56) References Cited

U.S. PATENT DOCUMENTS 5,795,823 A * 8/1998 Avanzino et al. ........... 438/639
6,696,355 B2 * 2/2004 Dennison .................... 438/597

* cited by examiner

Primary Examiner—Amir Zarabian
Assistant Examiner—Christy Novacek
(74) Attorney, Agent, or Firm—Bacon & Thomas, PLLC

(57) ABSTRACT

Disclosed is a method for forming bit line and bit line contact structure. Based on a semi-finished structure with a poly plug filled in a contact window, the method of the Invention comprises steps of removing some of the oxide layer so that the plug protrudes, oxidizing the exposed region of the protruding portion of the plug, removing the oxidized portion of the plug, forming a first dielectric layer to the upper surface of the resultant structure, wherein the upper surface of the plug is exposed, forming a second dielectric layer to the upper surface of the first dielectric layer including the upper surface of the plug, forming photoresist on the second dielectric layer, then performing exposing, developing and etching to form a trench of a predetermined pattern, and filling metal into the trench to form a bit line.

2 Claims, 4 Drawing Sheets

METHOD FOR FORMING DRAM CELL BIT LINE AND BIT LINE CONTACT STRUCTURE

BACKGROUND OF THE INVENTION

1. Field of the Invention

This invention relates to the manufacture of a dynamic random access memory (DRAM), and more specifically to the formation of a DRAM bit line and bit line contact structure.

2. Description of the Prior Art

In the manufacture of semiconductors, conducting wires and conducting wire contacts are used in large quantities. In DRAM manufacture, a contact window is formed in a cell structure, in which a polycrystal material is filled to form a plug, and the chemical mechanical polishing (CMP) is performed to constitute a bit line contact. The structure obtained from this stage is substantially similar to that in FIG. 2a. In the current manufacture process, however, the bit line contact formed has a large contact area. With DRAM becoming more and more compact, the interval between bit lines becomes narrower and narrower. Referring to FIG. 1, when the bit line contact 12 has a large contact area, the bit line 11 has a poor coverage to the bit line contact 12. If one bit line is slightly inclined, it is likely to cause an improper bridging, leading to an abnormal short circuit between bit lines. Therefore, a solution is needed to overcome this problem.

SUMMARY OF THE INVENTION

An object of the present invention is to provide a method for forming a bit line contact structure, making the formed bit line contact have a small contact area.

Another object of the present invention is to provide a method for forming a bit line and bit line contact structure, which can improve the coverage of bit line to bit line contact so as to avoid the improper short circuit between bit lines.

According to an aspect of the present invention, a bit line contact structure forming method, based on a semi-finished product structure whose contact window has been filled with a polycrystal plug (hereafter, the "poly plug"), comprises the following steps: removing some of the oxide layer to make the plug protrude; oxidizing of the exposed region of the protruding portion of the plug, and removing the oxidized portion of the plug.

According to another aspect of the present invention, a bit line and bit line contact structure forming method, based on a semi-finished product structure whose contact window has been filled with a poly plug, comprises the following steps: removing some of the oxide layer to make the plug protrude; oxidizing the exposed region of the protruding portion of the plug; removing the oxidized portion of the plug; forming a first dielectric layer on the upper surface of the entire structure, wherein the upper surface of the plug is exposed; forming a second dielectric layer on the upper surface of the first dielectric layer including the upper surface of the plug; coating photoresist on the second dielectric layer and performing exposing, developing and etching to form a trench of a predetermined pattern; and filling metal in the trench to form a bit line.

DETIALED DESCRIPTION OF THE PREFERRED EMBODIMENT

Figure 1:
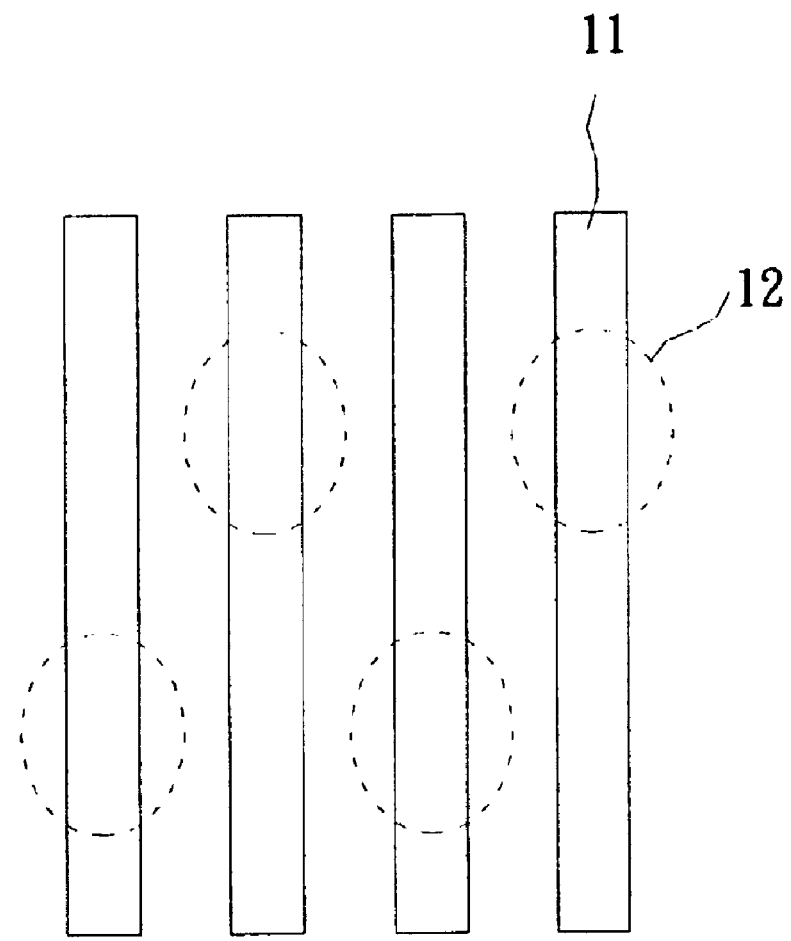
FIG. 1 is a schematic diagram showing the coverage of DRAM bit line to bit line contact in prior art.
Figure 2A:
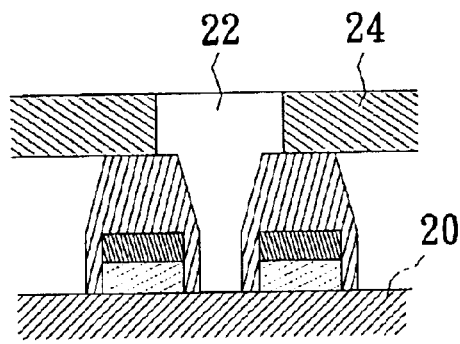
FIGS. 2a to 2g are cross sectional diagrams illustrating the steps of the present invention.

FIG. 2a shows a partial cross sectional diagram of the structure of a dynamic random access memory (DRAM) cell semi-finished product, wherein reference number 20 represents a substrate, 22 is a poly plug and 24 is an oxide layer. In this figure, the poly plug 22 has been inserted in a contact window. The upper surface of the structure can be planarized by chemical mechanical polishing (CMP).

Figure 2B:
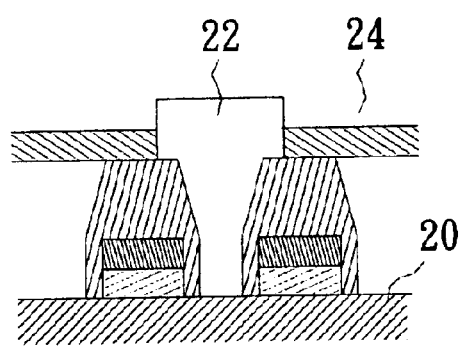

Referring to FIG. 2b, some of the oxide layer 24 is removed by wet etching or dry etching so that the poly plug 22 protrudes.

Figure 2C:
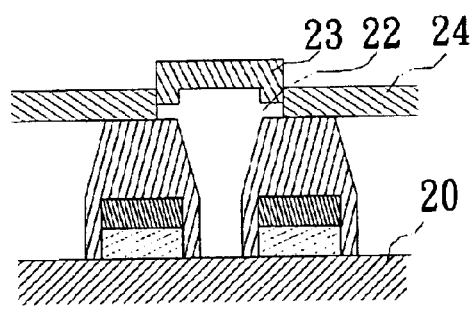

Then, the exposed region of the protruding portion of the poly plug 22 is oxidized so that an oxidized portion 23 is formed, as shown in FIG. 2c. The oxidation treatment can be carried out by any proper means.

Figure 2D:
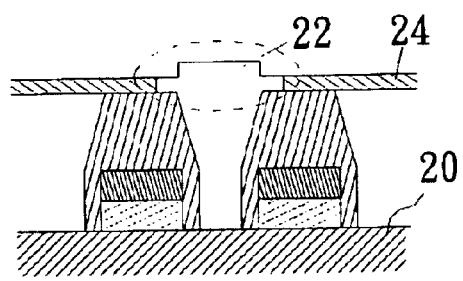

Subsequently, the oxidized portion 23 of the poly plug 22 is removed by a proper removing method such as wet etching, as shown in FIG. 2d.

Figure 2E:
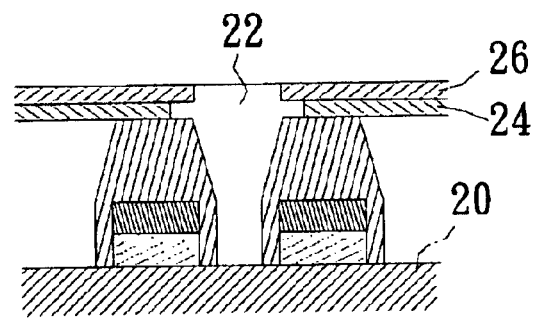

Referring to FIG. 2e, after the oxidized portion 23 of the poly plug 22 is removed, a first dielectric layer 26 is deposited on the entire structure. The material of the first dielectric layer 26 can be SiN, SiON or any proper material. The upper surface of the poly plug 22 is exposed. The surface of the entire structure can be planarized by CMP. The first dielectric layer 26 can serve as a stop layer for the planarization.

Figure 2F:
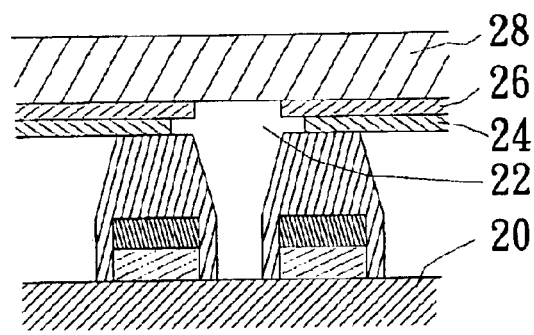

Then, a second dielectric layer 28 is deposited on the first dielectric layer 26, as shown in FIG. 2f. The second dielectric layer 28 can be an oxide layer. Perferably, the material of the second dielectric layer 28 is different from that of the first dielectric layer 26. When the materials of the first and second dielectric layers differ from each other, the first dielectric layer 26 can serve as the etching stop layer for subsequent manufacturing steps for the bit line. However, it is also possible to use a material which is the same as that of the first dielectric layer 26 for the second dielectric layer 28, and the method of the present invention is also applicable.

Then follows the common bit line manufacturing process. Photoresist is formed on the second dielectric layer 28 to from a photo mask. After exposing, developing and etching processes, trenches with predetermined patterns are formed in the second dielectric layer 28. Then, metal is filled in the trenches to form bit lines. Finally, the photoresist is removed. As mentioned above, the first dielectric layer 26 can serve as a stop layer at the time when trenches are formed.

Figure 2G:
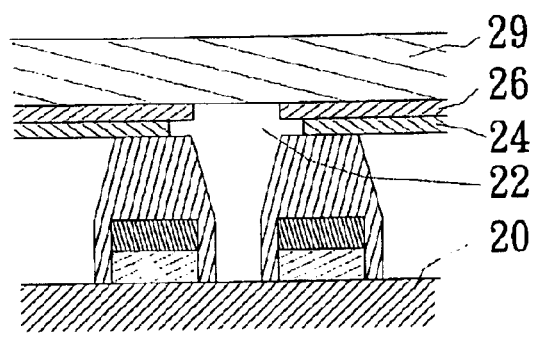

FIG. 2g shows the structure after the photoresist has been removed. This figure is a cross sectional diagram taken from the section of the bit line. In the figure, reference number 29 represents the section that constitutes the bit line. The material of the bit line can be copper, tungsten or any proper material.

Figure 3:
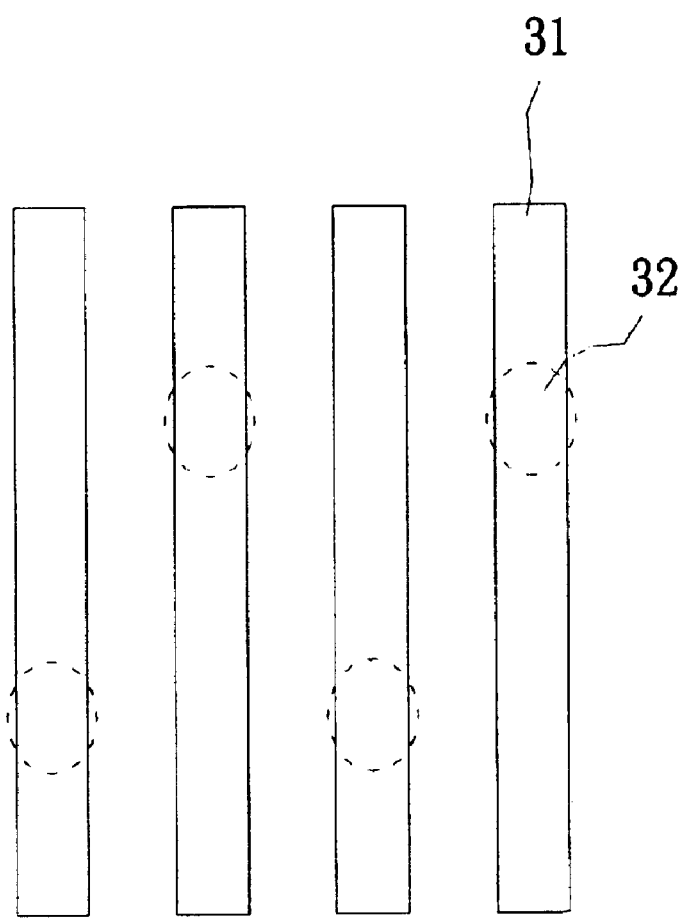
FIG. 3 is a schematic diagram showing the coverage of the bit line to bit line contact formed in the present invention.

As shown in the figures, the upper surface area of the poly plug 22 in the structure formed by the method of the present invention is small as compared to the prior art, that is, the critical dimension of the it line contact becomes small. As shown in FIG. 3, the reference number 31 indicates a bit line, and reference number 32 indicates a bit line contact in accordance with the present invention. Since the upper surface area of the bit line contact 32 becomes small, the coverage of the bit line 31 to bit line contact 32 is improved. Hence there is a large margin for the interval between the bit lines. In this case, a short circuit will not occur even if the bit line is slightly curved.

While the embodiment of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications which maintain the spirit and realm of the present invention are within the scope as defined in the appended claims.

What is claimed is:

1. A method for forming a contact structure for a semiconductor device, said semiconductor device having a contact window defined in an oxide layer, and a plug filled in said contact window, said method comprising steps of:

removing some of said oxide layer to make the plug protrude;

oxidizing the exposed region of the protruding portion of the plug to form an oxidized portion;

removing the oxidized portion of the plug so as to decrease an area of the top surface of the plug; and forming a first dielectric layer on the plug that has undergone said step of removing the oxidized portion, and on the oxide layer that has undergone said step of removing some of said oxide layer, wherein the upper surface of the plug that has undergone said step of removing the oxidized portion is exposed.

2. The method as recited in claim 1, further comprising a step of performing planarization after the first dielectric layer is formed.

* * * * *